US012808964B2

(12) United States Patent
Yokosawa et al.

(10) Patent No.: US 12,808,964 B2
(45) Date of Patent: Nov. 24, 2026

(54) MAGNETIC RESONANCE IMAGING APPARATUS AND CONTROL METHOD FOR THE SAME

(71) Applicant: FUJIFILM Corporation, Tokyo (JP)

(72) Inventors: Suguru Yokosawa, Tokyo (JP); Toru Shirai, Tokyo (JP)

(73) Assignee: FUJIFILM Corporation, Tokyo (JP)

( * ) Notice: Subject to any disclaimer, the term of this patent is extended or adjusted under 35 U.S.C. 154(b) by 142 days.

(21) Appl. No.: 18/823,352

(22) Filed: Sep. 3, 2024

(65) Prior Publication Data

US 2025/0093447 A1 Mar. 20, 2025

(30) Foreign Application Priority Data

Sep. 15, 2023 (JP) ................................ 2023-150407

(51) Int. Cl.

*G01R 33/483* (2006.01)
*G01R 33/56* (2006.01)
*G01R 33/561* (2006.01)

(52) U.S. Cl.

CPC ..... *G01R 33/4835* (2013.01); *G01R 33/5608* (2013.01); *G01R 33/561* (2013.01)

(58) Field of Classification Search

CPC ............ G01R 33/4835; G01R 33/5608; G01R 33/561

See application file for complete search history.

(56) References Cited

U.S. PATENT DOCUMENTS

| | | | | |
|---|---|---|---|---|
| 2016/0287191 | A1* | 10/2016 | Koehler | A61B 6/032 |
| 2019/0250233 | A1* | 8/2019 | Banerjee | G01R 33/5611 |
| 2020/0294280 | A1* | 9/2020 | Ding | G01R 33/482 |
| 2023/0324487 | A1* | 10/2023 | Jain | G01R 33/561 |

FOREIGN PATENT DOCUMENTS

| | | |
|---|---|---|
| JP | 2021-029777 A | 3/2021 |

OTHER PUBLICATIONS

Block, K.T., et al., "Undersampled Radial MRI with Multiple Coils. Iterative Image Reconstruction Using a Total Variation Constraint", Magn Reson Med 57: 1086-1098 (2007).

* cited by examiner

*Primary Examiner* — Gregory H Curran

(57) ABSTRACT

Image quality can be improved and acceleration can be achieved, by optimizing sampling in a blade type radial measurement using an MRI apparatus. In a case of performing a blade type radial measurement in which a k-space is radially sampled by varying an angle of a blade configured with a plurality of parallel sampling lines, interline intervals between the plurality of parallel sampling lines are set to uneven intervals for at least one of a plurality of the blades having different angles. The sampling using uneven intervals can be evaluated, and line intervals can also be adjusted based on an evaluation result.

14 Claims, 11 Drawing Sheets

MAGNETIC RESONANCE IMAGING APPARATUS AND CONTROL METHOD FOR THE SAME

CROSS-REFERENCE TO RELATED APPLICATIONS

The present application claims priority under 35 U.S.C. § 119 to Japanese Patent Application No. 2023-150407, filed Sep. 15, 2023, the content of which is hereby expressly incorporated by reference, in its entirety, into the present application.

BACKGROUND OF THE INVENTION

1. Field of the Invention

The present invention relates to a magnetic resonance imaging apparatus (hereinafter, referred to as an MRI apparatus), and particularly, to a technology of controlling a data sampling pattern of the MRI apparatus.

2. Description of the Related Art

An MRI apparatus encodes nuclear magnetic resonance signals by collecting the nuclear magnetic resonance signals while applying gradient magnetic fields having different magnitudes to a static magnetic field and assigns positional information to the nuclear magnetic resonance signals, which are a sum of nuclear spins having spatial distributions. The encoded nuclear magnetic resonance signals are collected as k-space data in a frequency domain, and the k-space data is converted into an image through calculations such as FFT.

The k-space data is 2D or 3D data having axes corresponding to gradient magnetic fields in three axial directions in a real space, and in general imaging, Cartesian sampling is performed to collect the k-space data along the axial directions. In addition, there is also radial sampling in which sampling is radially performed from a center of a k-space.

Since the radial sampling is a technique of frequently sampling a central region of the k-space, that is, a low-frequency region contributing to image contrast, the radial sampling is an imaging method that is robust against motion and can suppress blood flow artifacts. However, there are techniques such as sampling where an angle changes for each radial line or using a plurality of sampling lines for each angle for measurement (blade type radial measurement). A plurality of lines at the same angle are called blades.

A general problem of MRI is to reduce artifacts and to shorten an imaging time, and various techniques have been proposed to solve the problem. For example, Magnetic Resonance in Medicine 57:1086-1098 (2007), "Undersampled Radial MRI with Multiple Coils. Iterative Image Reconstruction Using a Total Variation Constraint" discloses a technology of reducing artifacts by performing iterative reconstruction to minimize a difference between each channel data and channel data after sensitivity correction in radial sampling MRI in which a single line is rotated. In addition, JP2021-029777A discloses that k-space sampling is controlled to reduce body movement artifacts, full sampling is performed in a center region, and thinning-out sampling is performed in a peripheral region.

SUMMARY OF THE INVENTION

For the blade type radial measurement, reducing artifacts while shortening the imaging time is required.

In the blade type radial measurement, measurements are repeatedly performed for each blade by varying the angle of the blade, and a circular region centered on an origin of the k-space is measured, and a sampling pattern is determined by the number of blades, that is, the number of shots, and the number of lines constituting each blade, that is, echo train length (ETL). Here, in order to accelerate imaging, it is necessary to set the ELT or the number of shots to be smaller and to reduce the radial sampling lines, but reducing the sampling lines may lead to a gap (a region where data cannot be collected) occurring in a high-frequency region, causing streak artifacts.

To address such a problem of the blade type radial measurement, the technology described in Magnetic Resonance in Medicine 57:1086-1098 (2007), "Undersampled Radial MRI with Multiple Coils. Iterative Image Reconstruction Using a Total Variation Constraint" employs iterative reconstruction to reduce artifacts, but image quality may change depending on the sampling pattern, and there is a possibility that artifact reduction may not be achieved. In addition, the technology described in JP2021-029777A is based on Cartesian sampling as its fundamental approach, so that optimization of the sampling pattern in the blade type radial measurement in which sampling patterns differ cannot be applied.

An object of the present invention is to provide an MRI apparatus capable of performing optimal sampling from the viewpoint of improving image quality and reducing artifacts in a case of performing a blade type radial measurement.

In order to achieve the above-described object, the present invention makes it possible to suppress artifacts while reducing the number of blades by controlling a sampling pattern in a blade in the blade type radial measurement.

That is, according to an aspect of the present invention, there is provided an MRI apparatus comprising: an imaging unit that collects k-space data by measuring a nuclear magnetic resonance signal generated by a subject in accordance with a predetermined pulse sequence; and a controller that controls sampling of the nuclear magnetic resonance signal. The controller performs control of radially sampling a k-space by varying an angle of a blade configured with a plurality of parallel sampling lines, and in the control, sets interline intervals between the plurality of parallel sampling lines to uneven intervals for at least one of a plurality of the blades having different angles.

In addition, according to another aspect of the present invention, there is provided a control method for an MRI apparatus including an imaging unit that collects k-space data by measuring a nuclear magnetic resonance signal generated by a subject in accordance with a predetermined pulse sequence, the control method comprising: performing control of radially sampling a k-space by varying an angle of a blade configured with a plurality of parallel sampling lines, and in the control, setting interline intervals between the plurality of parallel sampling lines to uneven intervals for at least one of a plurality of the blades having different angles.

According to the aspects of the present invention, by setting the interline intervals in the blade to uneven intervals, it is possible to mitigate a significant difference in sampling density between a high-frequency region and a low-frequency region of the k-space and to optimize the overall sampling density. As a result, it is possible to reduce streak artifacts caused by the sparse high-frequency region even in a case in which the number of blades is reduced.

DESCRIPTION OF THE PREFERRED EMBODIMENTS

Hereinafter, embodiments of an MRI apparatus according to the present invention will be described with reference to the accompanying drawings.

The MRI apparatus comprises, in a broad sense, an imaging unit that collects data for reconstructing an image of a subject by measuring a nuclear magnetic resonance signal generated from the subject, and a computer that controls an operation of the imaging unit and that performs various calculations using the data collected by the imaging unit. In the MRI apparatus of the embodiment of the present invention, a configuration of the imaging unit is similar to that of a general MRI apparatus, but the MRI apparatus of the embodiment of the present invention is characterized in that a function of controlling and optimizing sampling of a k-space in a case in which the imaging unit performs a blade type radial measurement is provided as a main function of the computer.

Embodiment 1: Embodiment Excluding Evaluation Unit

Figure 1:
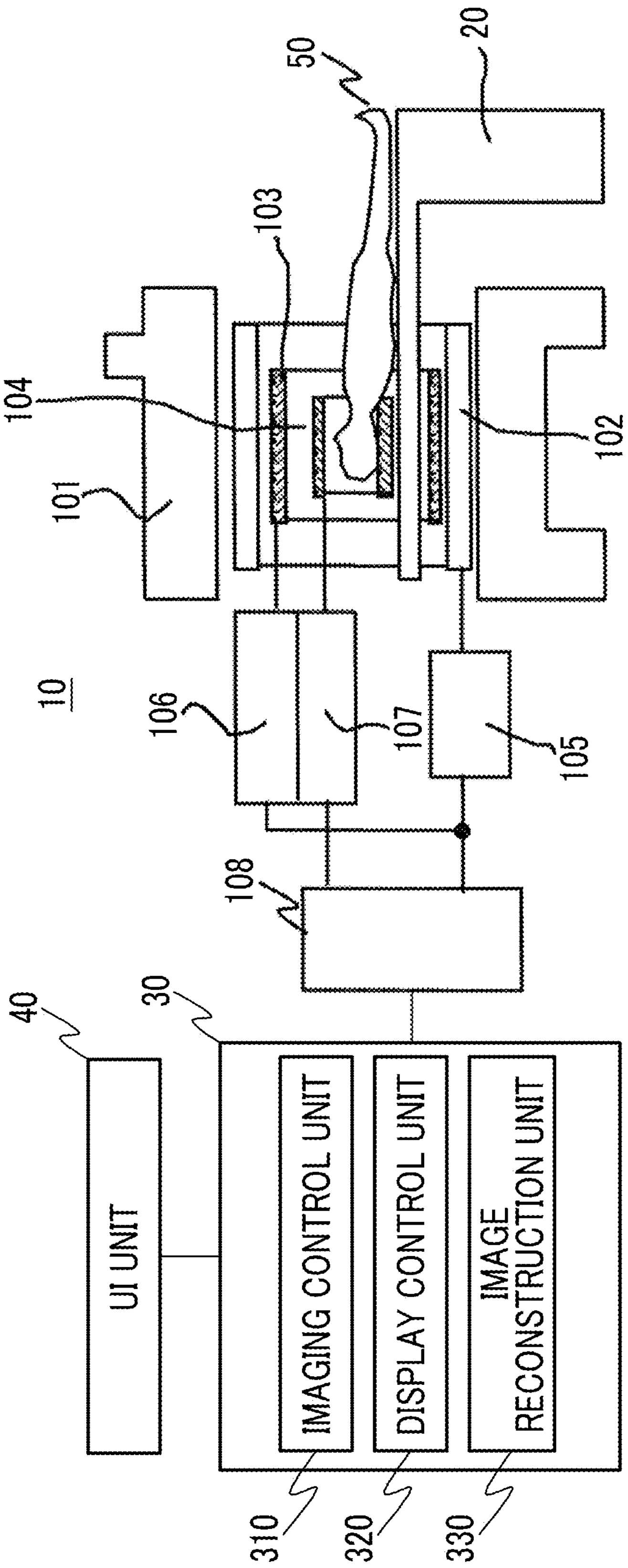
FIG. 1 is a diagram showing an outline of an MRI apparatus to which the present invention is applied.

First, an outline of a configuration of the MRI apparatus will be described. As shown in FIG. 1, an MRI apparatus 1 comprises an imaging unit 10 and a computer 30, and a subject 50 is disposed in an imaging space of the imaging unit 10 in a state of lying on a patient table device 20. A UI unit 40 provided with a display device or an input device for an interface with an operator (user) is connected to the computer 30.

A configuration of the imaging unit 10 is similar to that of a general MRI apparatus and comprises a static magnetic field magnet 101 that forms a uniform static magnetic field in the imaging space, gradient magnetic field coils 102 that provide magnetic field gradients in three orthogonal axial directions to the static magnetic field, an RF transmission coil 103 for irradiating the subject 50 with a high-frequency magnetic field, an RF reception coil 104 that receives a nuclear magnetic resonance signal generated from the subject 50, and a sequencer 108.

The gradient magnetic field coils 102 in the three axial directions are each connected to a gradient magnetic field power supply 105 and generate gradient magnetic fields corresponding to power supplied from the gradient magnetic field power supply 105. In addition, by combining the gradient magnetic fields in the three axial directions, it is possible to generate a gradient magnetic field of any magnitude in any direction.

The RF transmission coil 103 is connected to a transmitter 106 provided with a high-frequency magnetic field generator, a high-frequency amplifier, and the like and irradiates the subject with a high-frequency magnetic field having a predetermined frequency as an RF pulse in response to an output from the transmitter 106.

The RF reception coil 104 is connected to a receiver 107 provided with an amplifier, a quadrature detector, an A/D converter, and the like. The receiver 107 samples the nuclear magnetic resonance signal by using the A/D converter and passes the nuclear magnetic resonance signal to a signal processing system (computer 30) as digital data. The RF reception coil 104 may be a multi-channel coil consisting of a plurality of small coils, and in that case, data is collected for each channel of each small coil.

The sequencer 108 operates the gradient magnetic field power supply 105, the transmitter 106, and the receiver 107 in accordance with a predetermined pulse sequence. Various pulse sequences are stored in the apparatus, and in imaging, the sequencer 108 calculates a pulse sequence to be used for the imaging by using an imaging condition and an imaging parameter set via the UI unit 40 or the like and performs the imaging based on the calculated pulse sequence. In the present embodiment, imaging based on the blade type radial measurement is performed.

Figure 2:
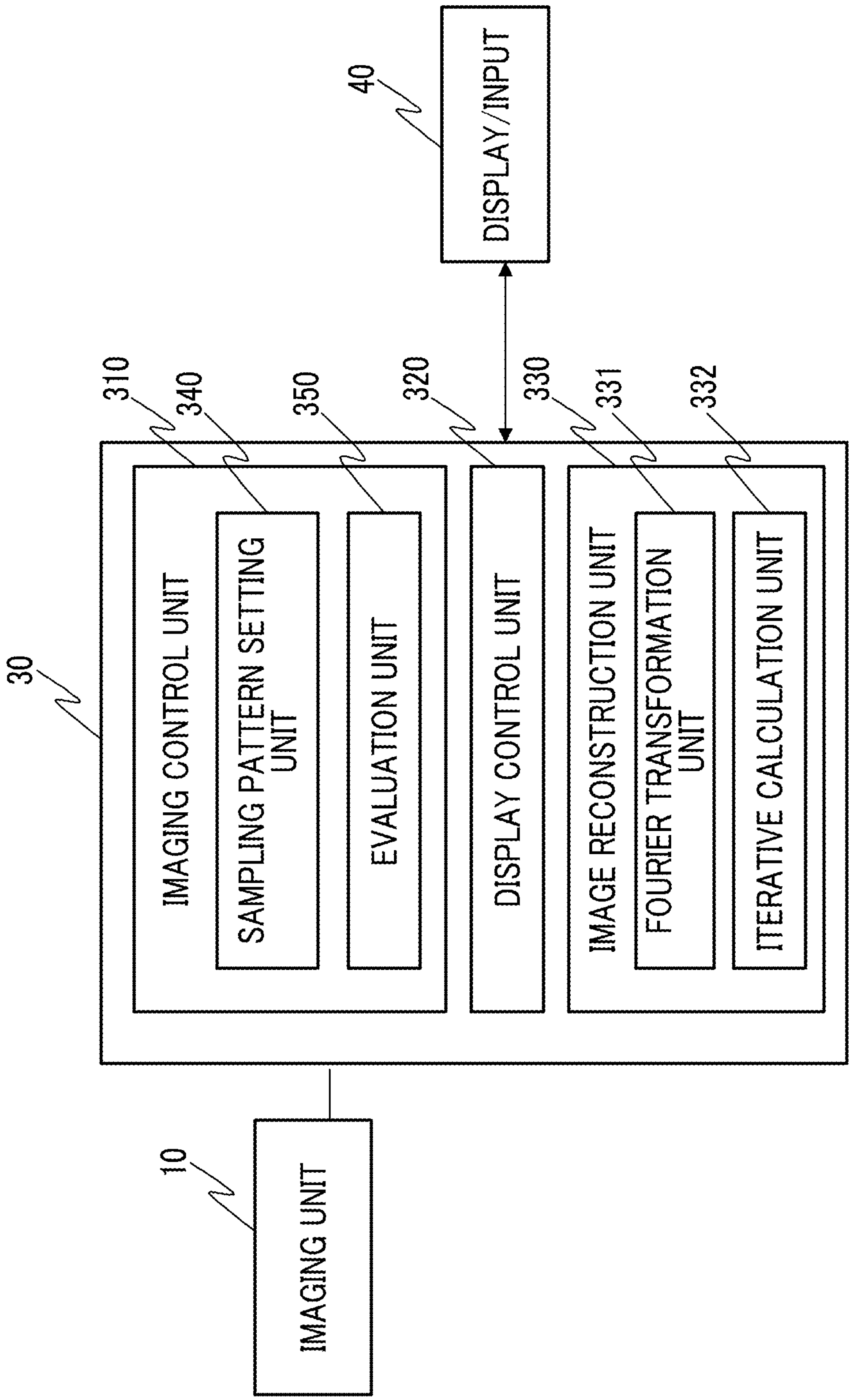
FIG. 2 is a functional block diagram of a controller of Embodiment 1.

The computer 30 can be configured as a computer provided with a CPU and a memory and implements a function as a control unit, such as an imaging control unit 310 and a display control unit 320, and a function as a calculation unit, such as an image reconstruction unit 330. The imaging control unit 310 controls an operation of the imaging unit 10 via the sequencer 108. In addition, in the MRI apparatus 1 of the present embodiment, the imaging control unit 310 controls a sampling pattern of each blade in a case of the blade type radial measurement. FIG. 2 shows an example of a functional block diagram of the computer 30 related to control of the blade type radial measurement.

As shown in the drawing, the imaging control unit 310 is provided with a sampling pattern setting unit 340. The sampling pattern setting unit 340 determines the number of blades (the number of shots), a rotation angle, a blade width, and the number of measurement lines in the blade from the imaging condition input by the user and sets a sampling pattern using uneven intervals for interline intervals, in the blade type radial measurement.

The image reconstruction unit 330 performs image reconstruction on k-space data obtained in the blade type radial measurement by using an appropriate image reconstruction method. For example, image reconstruction using fast Fourier transformation or image reconstruction using iterative calculations such as compressed sensing is performed. In addition, in a case in which the RF reception coil is a multi-channel coil, combination of the data collected for each channel, parallel imaging reconstruction using a sensitivity distribution of each small coil, or the like is performed.

Further, the computer 30 may be provided with a function of evaluating the sampling pattern of the blade type radial measurement (evaluation unit 350). For example, the evaluation unit 350 calculates an evaluation value based on a predetermined evaluation criterion for the sampling pattern and generates a pre-image such as a simulation image in a case of using the sampling pattern.

The display control unit 320 displays a GUI for accepting a user setting for the imaging condition of the blade type radial measurement, particularly, for the sampling pattern, on the UI unit 40 and accepts the user setting through the GUI to pass the user setting to the imaging control unit 310. In a case in which the evaluation unit 350 is provided, an evaluation result by the evaluation unit 350 or the pre-image generated by a pre-image generation unit 353 is displayed on the UI unit 40.

The functions of the control unit and the calculation unit of the computer 30 described above are stored in advance in the memory as programs and are implemented by the CPU uploading and executing the program of each function. Note that a part of the functions of the computer 30 can also be executed by a programmable IC.

Next, the blade type radial measurement and the sampling pattern thereof will be described.

First, a pulse sequence of the blade type radial measurement and k-space data collected by the blade type radial measurement will be described.

Figure 3:
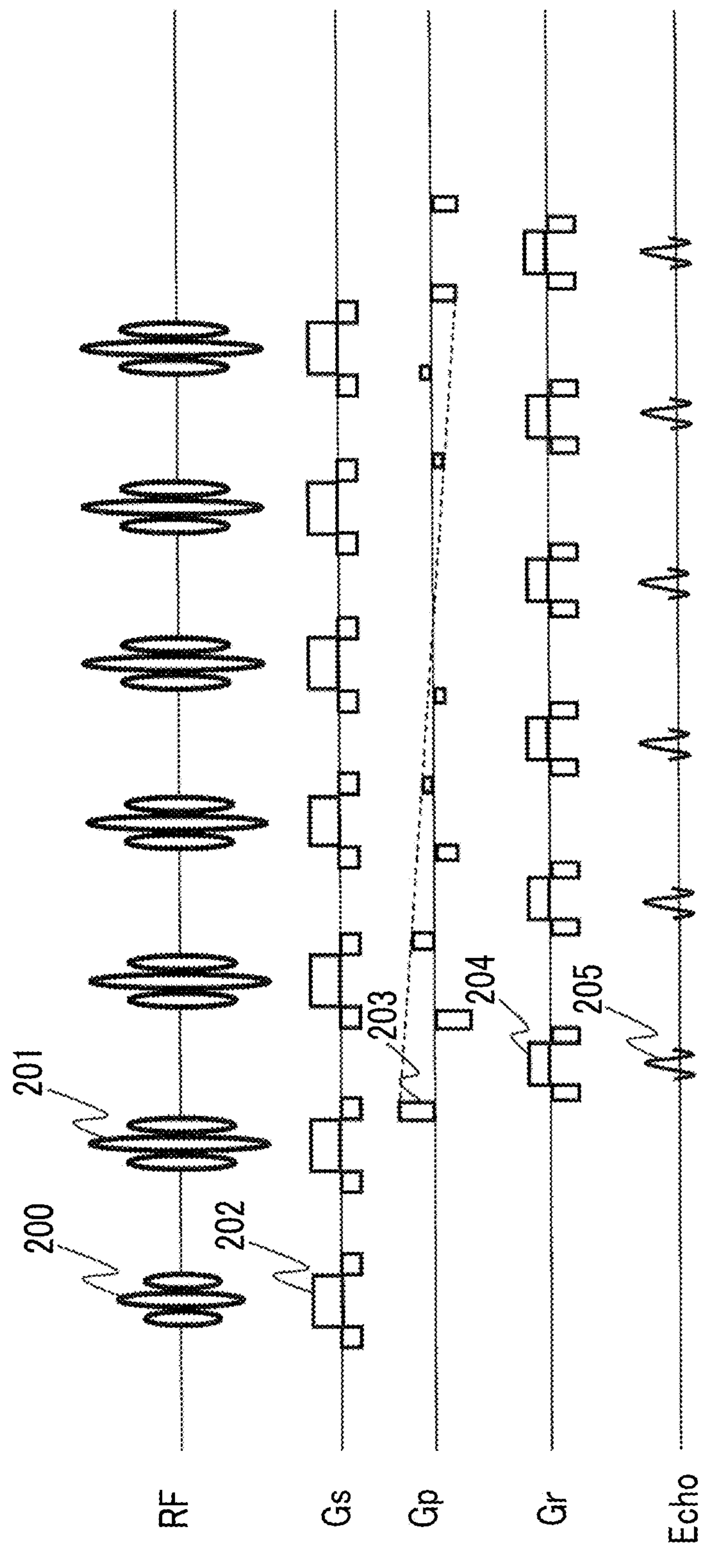
FIG. 3 is a diagram showing an example of a pulse sequence.

The pulse sequence used for imaging of the blade type radial measurement is not limited, but a pulse sequence in which a plurality of nuclear magnetic resonance signals are continuously acquired after one excitation RF pulse (hereinafter, referred to as an excitation pulse) is applied is executed. Examples of such a pulse sequence include a sequence of a fast spin echo (FSE) method and a gradient echo-based pulse sequence. FIG. 3 shows the pulse sequence for FSE as an example. In this FSE sequence, the nuclear magnetic resonance signal is generated as a spin echo 205 by applying an inversion RF pulse 201 and is measured. The inversion RF pulse 201 is repeatedly applied while varying a magnitude of a phase-encoding gradient magnetic field (Gp) 203 for each inversion RF pulse, and data for one blade is collected. One echo 205 corresponds to one line in the blade. Although six echoes are shown in FIG. 3, the number of echoes is optional.

By executing a similar pulse sequence by varying axes (combination of two axes) of a readout gradient magnetic field (Gr) and the phase-encoding gradient magnetic field (Gp), data with different blade angles on the same slice plane can be collected. Although FIG. 3 shows a 2D pulse sequence in which a slice gradient magnetic field (Gs) 202 for selecting a slice plane is applied together with an excitation pulse 200 and the inversion RF pulse 201, a 3D pulse sequence using a slice-encoding gradient magnetic field may be used.

Figure 4:
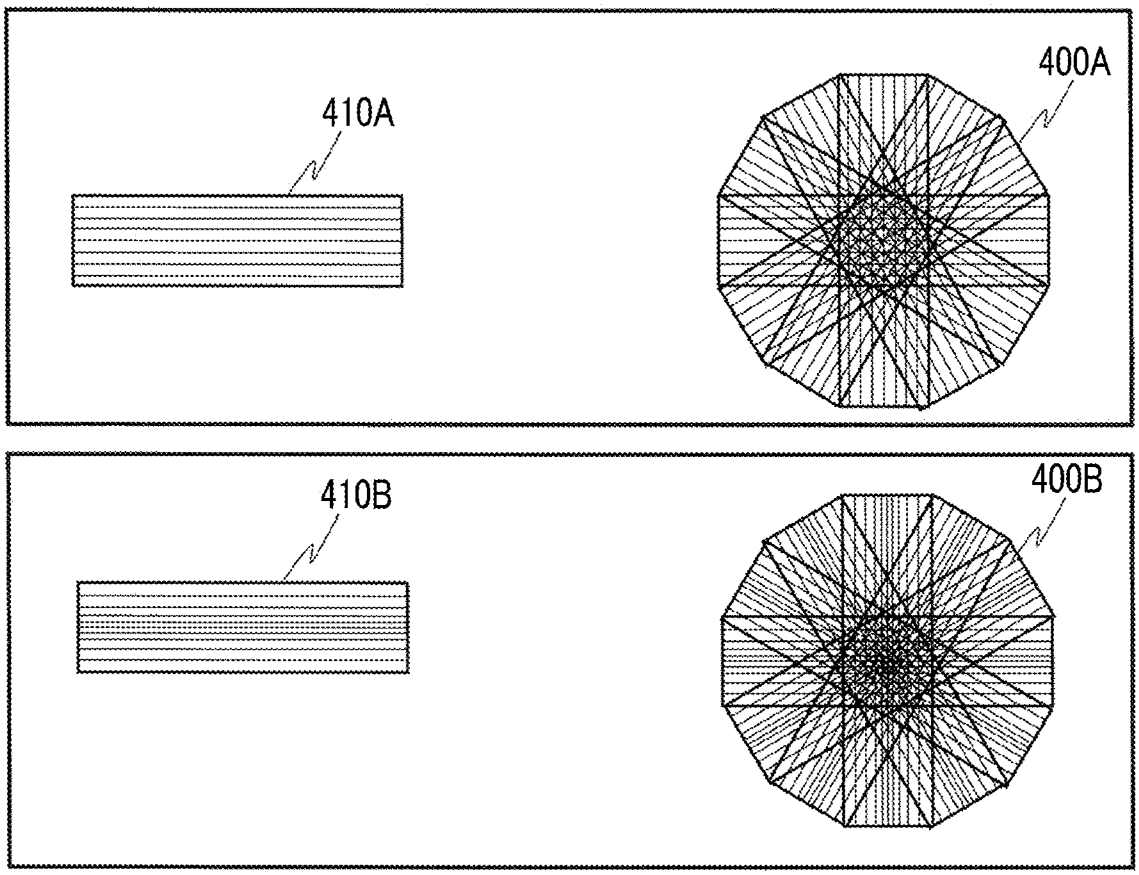
FIG. 4 is a diagram illustrating radial sampling.

A k-space arrangement of data obtained by such a blade type radial measurement, that is, the sampling pattern, is shown in FIG. 4. An upper side of FIG. 4 is an example of k-space data obtained in a general blade type radial measurement, and one blade 410A is shown on a left side, and all pieces of k-space data 400A obtained by rotating the blade for the measurement are shown on a right side. In a general sampling pattern, lines in the blade are arranged at even intervals. In a case in which the intervals in the blade are even intervals, the influence of thinning out results in coherent signals, which cause artifacts. The MRI apparatus of the present embodiment employs a sampling pattern 400B in which lines in a blade 410B have uneven intervals.

The line intervals in the blade are determined by how an encoding step of the phase-encoding gradient magnetic field pulse 203 is changed, and in the general sampling pattern, the change in the encoding step indicated by a broken line in FIG. 3 is linear, whereas in the present embodiment, the change is made non-linear to control the line intervals to uneven intervals.

The aspect of the uneven intervals is not limited, and an example of the uneven intervals in which data in a peripheral region is thinned out by making a center region of the blade dense is shown on a lower side of FIG. 4, but there is also an aspect in which the line intervals are made random.

Figure 5:
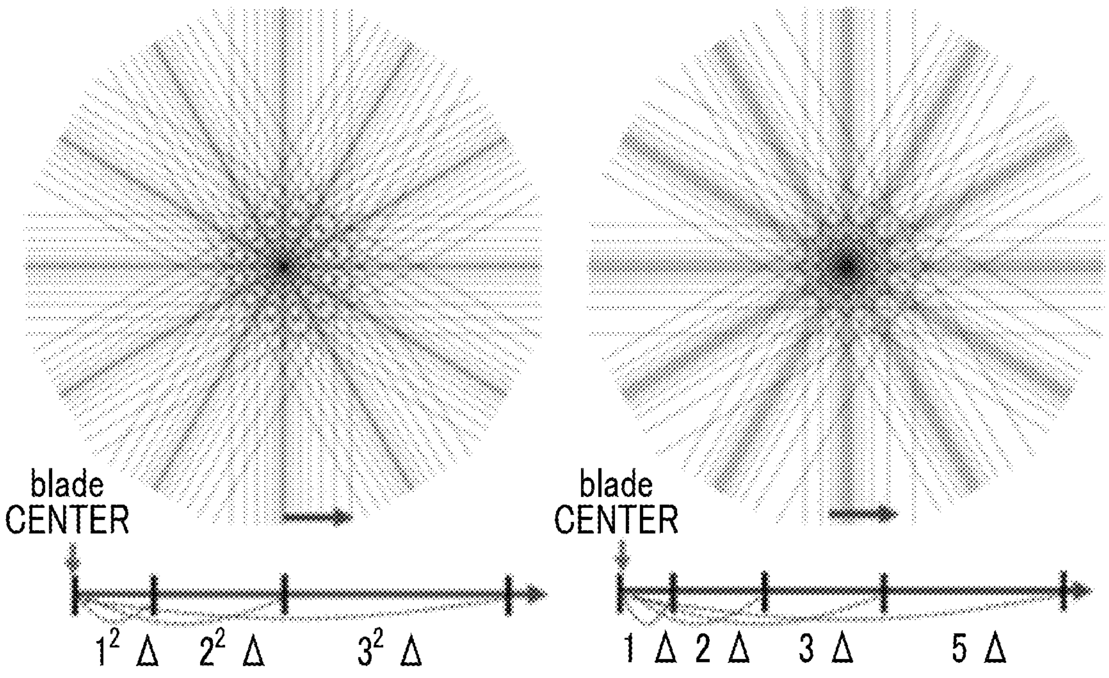
FIG. 5 is a diagram showing an example of a sampling pattern of Embodiment 1.

FIG. 5 shows details of the sampling pattern of the uneven intervals in which the intervals are wider from the center toward the periphery. The left side of FIG. 5 is an example using geometric series intervals, and the right side is an example using Fibonacci intervals. In a case in which a width between a central line of the blade and an n-th line from the end is denoted by wb, an interval between the central line of the blade and the n-th line (where n=1, 2, . . . ) is $n^2\Delta$, where $\Delta=wb/n^2$, in the geometric series intervals. In the Fibonacci intervals, Δ is calculated such that the line intervals are equal to the Fibonacci sequence (excluding the first 0 and 1)×Δ. In addition to these, as the uneven intervals in which the intervals are wider from the center toward the periphery, there are intervals that change in accordance with quadratic functions, and the like, and all of these can be employed.

Figure 6:
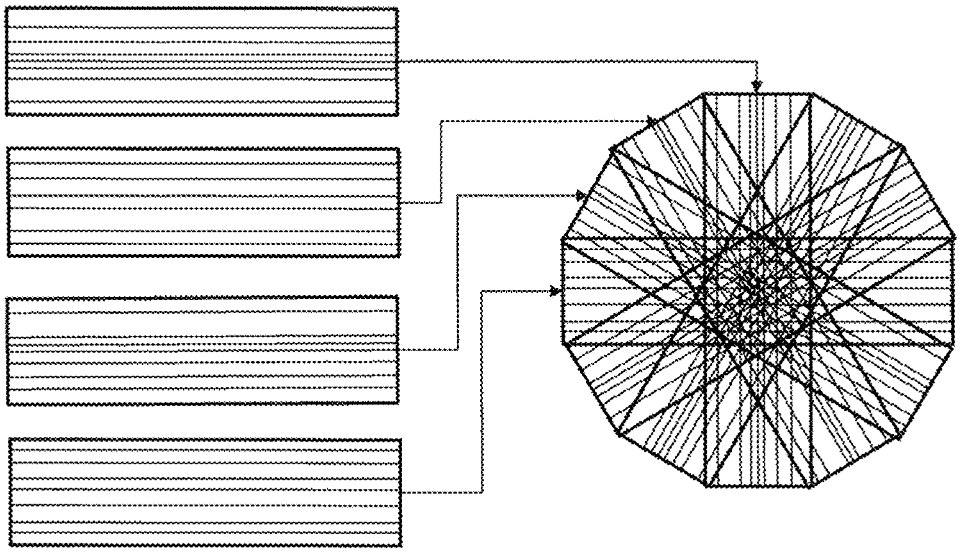
FIG. 6 is a diagram showing another example of the sampling pattern of Embodiment 1.

In a case of iterative calculations involving image reconstruction with transformation into a sparse space such as compressed sensing, it is preferable that the data is random. Therefore, random sampling is suitable. In that case, as the patterns for the uneven intervals, instead of a pattern in which the line intervals gradually increase/decrease as shown in FIG. 5, a pattern may be used in which the line intervals randomly change in the blade, or patterns may differ between blades (randomness between the blades) as shown in FIG. 6. In the example of FIG. 6, the line intervals differ for each blade.

In addition, in the sampling pattern, all the blades may have uneven intervals, or some blades may have even intervals and some other blades may have uneven intervals. Further, in a case in which a plurality of blades have uneven intervals, the patterns for the plurality of blades may be the same or different.

Among the sampling patterns exemplified above, which sampling pattern to use may be set in advance or may be set by accepting a user setting or user adjustment via the UI unit 40.

Figure 7:
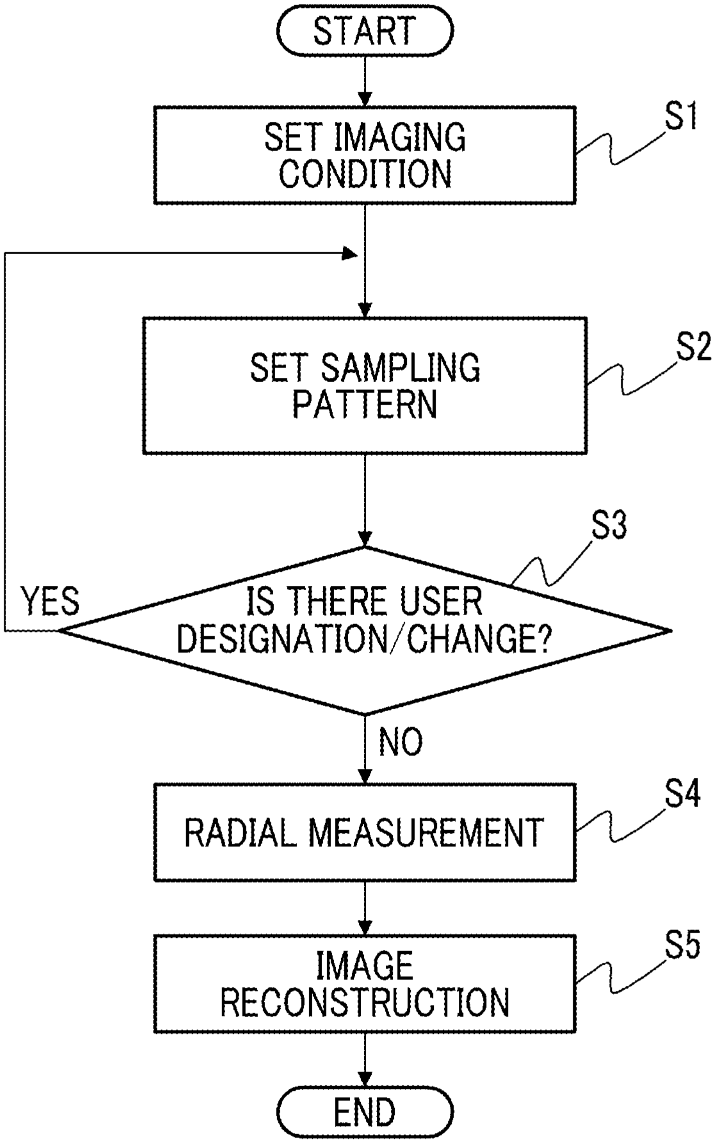
FIG. 7 is a diagram showing a flow of control of Embodiment 1.

Hereinafter, a flow of the imaging control in the MRI apparatus having the above-described configuration will be described. As shown in FIG. 7, first, in a case in which the blade type radial measurement is set as the imaging condition (S1), the sampling pattern setting unit 340 determines imaging parameters (the number of blades, the blade width, and the number of measurement lines (echo train length: ETL) in the blade and sets the sampling pattern (S2). Specifically, a blade-shaped sampling region is installed at a position rotated about the origin on the k-space, and measurement lines parallel to each other in a longitudinal direction of the blade are set in each of the blades. In this case, the measurement lines are installed at uneven intervals in a transverse direction of the blade. The encoding step of the phase-encoding gradient magnetic field pulse is determined based on the set sampling pattern.

In a case in which there is no user designation (S3), the imaging control unit 310 controls the imaging unit 10 in the determined encoding step to perform the blade type radial measurement (S4). That is, echoes are measured, for example, in accordance with the FSE pulse sequence as shown in FIG. 3, and the k-space data as shown on the lower side of FIG. 4 is collected.

The image reconstruction unit 330 reconstructs the image through calculations using the collected k-space data (S5).

The technique of image reconstruction is the same as the reconstruction of a general radial scan, and the image is reconstructed through fast Fourier transformation (FFT) after gridding (data rearrangement onto grid points in the k-space) or iterative calculations. In that case, sensitivity correction of the reception coil or channel combination is performed as necessary. The optimal reconstruction method may be automatically selected according to the set sampling pattern.

In a case in which the adjustment or the designation by the user is accepted for the sampling pattern set by the sampling pattern setting unit 340 (S3), the sampling pattern setting unit 340 determines the sampling pattern again based on the condition designated by the user, and the process transitions to step S4.

According to the present embodiment, in the blade type radial measurement in which the k-space data is collected by varying the angle of the blade, by controlling the interline intervals in the blade to uneven intervals, it is possible to suppress the occurrence of artifacts that are likely to occur in a case of the even intervals. In addition, even in a case in which the k-space is thinned out and measured, the sampling pattern can be optimized, and the imaging can be accelerated while suppressing the decrease in image quality.

Embodiment 2

Figure 8:
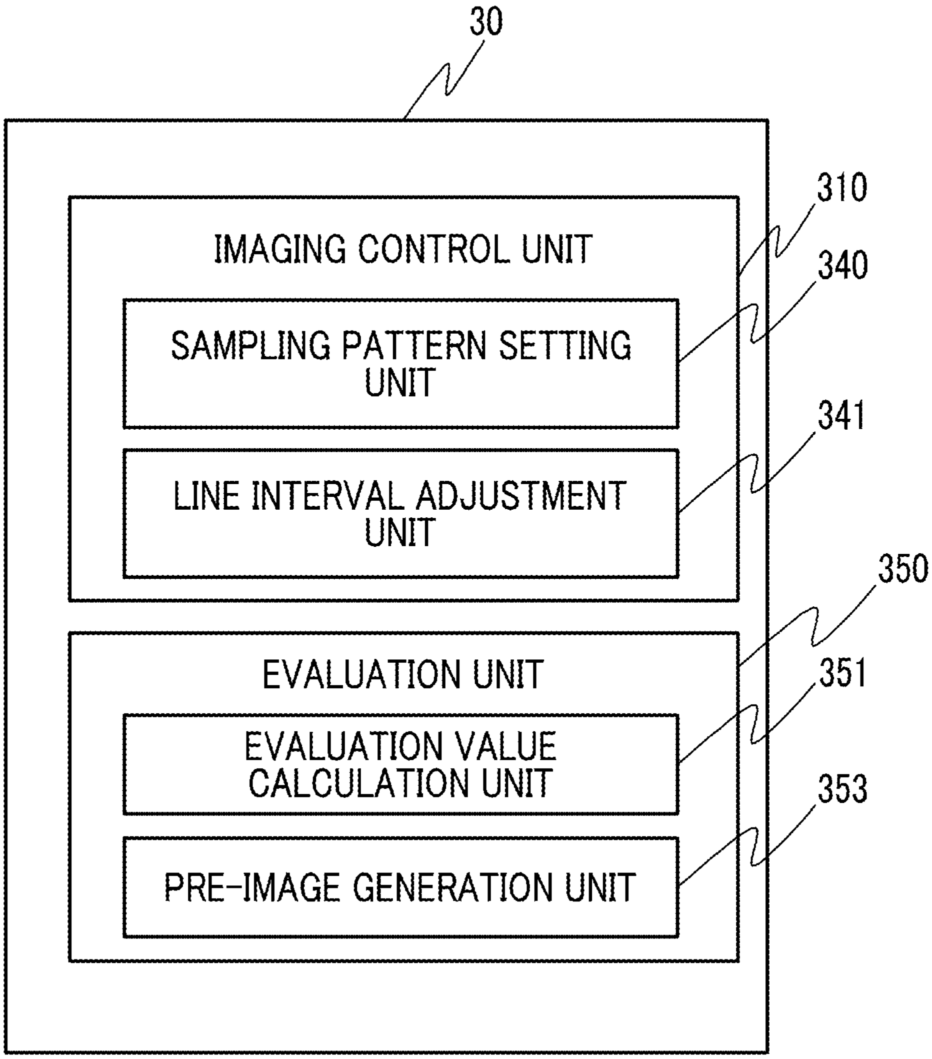
FIG. 8 is a functional block diagram of a controller of Embodiment 2.

In the present embodiment, an adjustment function based on the evaluation of the sampling pattern and the evaluation result is added to the control unit of Embodiment 1. FIG. 8 shows a configuration of a computer of the present embodiment. In FIG. 8, elements similar to those in FIG. 2 are designated by the same reference numerals, and the duplicated description thereof will be omitted.

As shown in FIG. 8, the MRI apparatus of the present embodiment comprises the evaluation unit 350 that is provided in the computer 30 and that calculates an indicator of whether the sampling pattern set by the sampling pattern setting unit 340 is appropriate. In the present embodiment, the evaluation unit 350 comprises an evaluation value calculation unit 351 and the pre-image generation unit 353, and the evaluation unit 350 calculates an evaluation value based on a predetermined criterion and generates a prediction image (hereinafter, referred to as a pre-image) obtained in a case in which the blade type radial measurement is performed using the set sampling pattern. However, the indicator of the evaluation may be any one of the evaluation value or the pre-image, and in that case, one of the evaluation value calculation unit 351 or the pre-image generation unit 353 can be omitted.

In addition, in the present embodiment, as the functions of the imaging control unit 310, a line interval adjustment unit 341 that adjusts line intervals in the blade may be provided. A function of adjusting the line intervals will be described below.

The evaluation of the sampling pattern is to evaluate how the sampling pattern affects the point spread function (PSF). Examples of the indicator for evaluating the influence on the PSF include a maximum value of sidelobes of the PSF in the sampling pattern and a sampling density.

The PSF in the sampling pattern can be created by gridding simulated data in which a sampling position is set to 1 and the other positions are set to 0, and then performing Fourier inverse transformation. From the sidelobe shape of the PSF, the maximum value of the sidelobes is calculated, and the value is used as the evaluation value.

Figure 9:
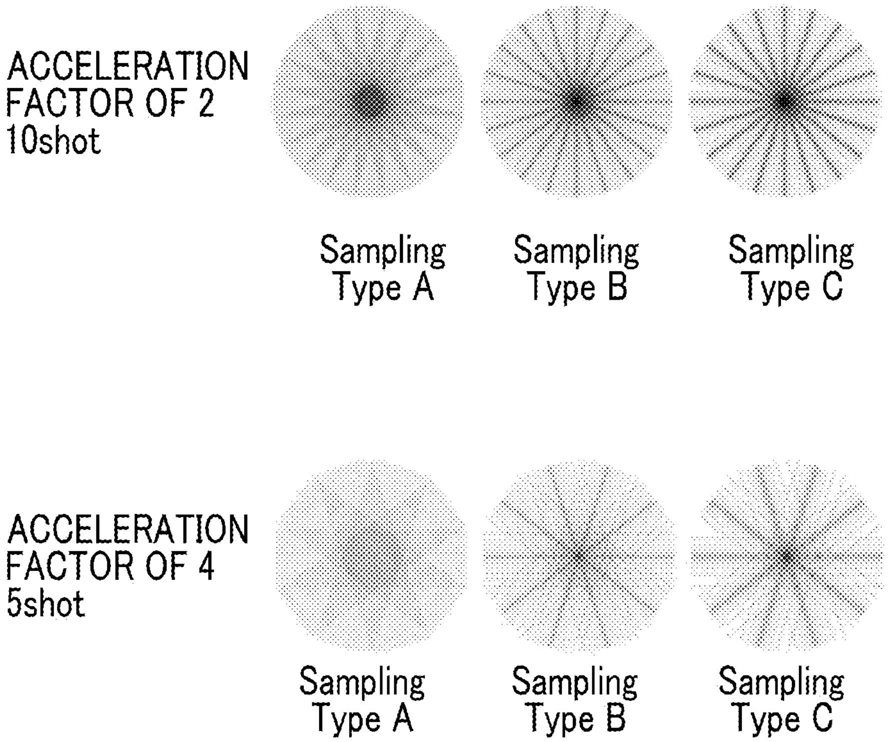
FIG. 9 is a diagram showing sampling patterns.
Figure 10:
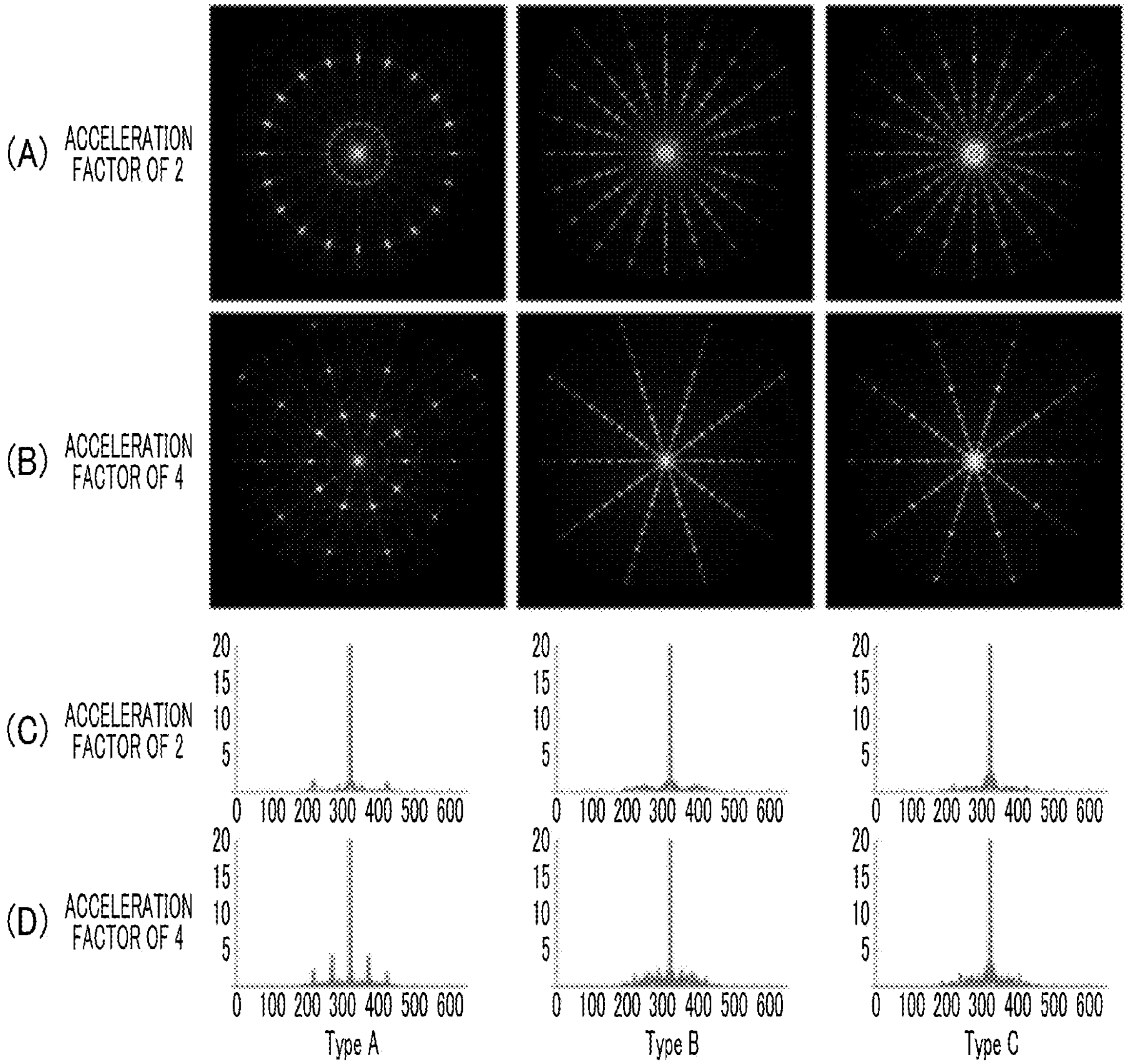
FIG. 10 is a diagram illustrating evaluation of the sampling patterns.

The sidelobes and the maximum value thereof will be described in detail by using FIGS. 9 and 10. FIG. 9 shows each sampling pattern of the general blade type radial measurement (Type A) in which the line intervals in the blade are uniform and the blade type radial measurements (Type B and Type C) of the embodiment of the present invention, and FIG. 10 is a diagram showing results of the PSF in these three sampling patterns, in which an upper side of FIG. 10 is PSF images, and (A) is a case in which the acceleration factor is 2, and (B) is a case in which the acceleration factor is 4. The lower side of FIG. 10 shows horizontal line profiles passing through the origins of the images on the upper side, in which (C) is a case in which the acceleration factor is 2, and (D) is a case in which the acceleration factor is 4. All the blade type radial measurements are for 10 shots (the number of blades=10). In addition, Type B is sampling with geometric series intervals, and Type C is sampling with Fibonacci intervals.

As shown in (A) of FIG. 10, in the blade type radial measurement of Type A, the sidelobes of the PSF are scattered in a ring shape around the origin. Meanwhile, in Type B and Type C, the sidelobes of the PSF show radial spreading. As shown in (C) of FIG. 10, in the profiles, in Type A, a state in which signals are scattered is clearly observed as peaks of the sidelobes, while in Type B and Type C, the sidelobes are flattened, and significant peaks are not observed.

As shown in (D) of FIG. 10, in a case in which a thinning-out rate increases (in a case in which the thinning-out rate is 4), the magnitude of the sidelobe increases in all cases as compared with a case in which the thinning-out rate is 2, but the tendency remains the same as in a case where the thinning-out rate is 2, and the sidelobes are distinct in Type A, but the sidelobes are flattened in Type B and Type C.

In a case in which the sidelobes are clearly divided, the maximum value is large, which causes the occurrence of the artifacts. Therefore, by knowing the magnitude of the maximum value, it is possible to evaluate to what extent the artifacts are suppressed.

Regarding the sampling density, the sampling pattern is divided into regions, the density of the sampling point is calculated for each region, and it is evaluated whether the sampling density of each region is within an appropriate range. For example, predetermined threshold values (Th1, Th2) are set for the peripheral region and the center region, and then the evaluation value for the density is calculated based on a criterion such as (1) the peripheral region is not completely sparse (for example, the sampling density of the peripheral region is equal to or greater than the threshold value Th1) and (2) the center region is relatively dense (for example, the sampling density of the center region is the threshold value Th2).

For the pre-image, for example, an image in a case in which the blade type radial measurement is performed for each sampling pattern by using a digital phantom can be generated in advance. In a case in which the sampling pattern is set, the pre-image generated for the pattern is displayed. Since the images differ depending on the number of lines in the blade and the thinning-out rate, the pre-image is generated by varying these conditions for each sampling pattern, and then the pre-image is selected and displayed in conformity with the conditions for the set sampling pattern.

The display control unit 320 may display the images generated by the pre-image generation unit 353 as the sequentially changed pre-images in a thumbnail manner each time the sampling pattern, which is the processing target of the evaluation unit 350, and the conditions thereof are changed.

The user can determine whether the measurement may proceed with the set sampling pattern by referring to the above-described evaluation value and pre-image and can also change the pattern or the condition to perform the selection of the pattern, the adjustment of the number of lines or the acceleration factor, and the like again.

Figure 11:
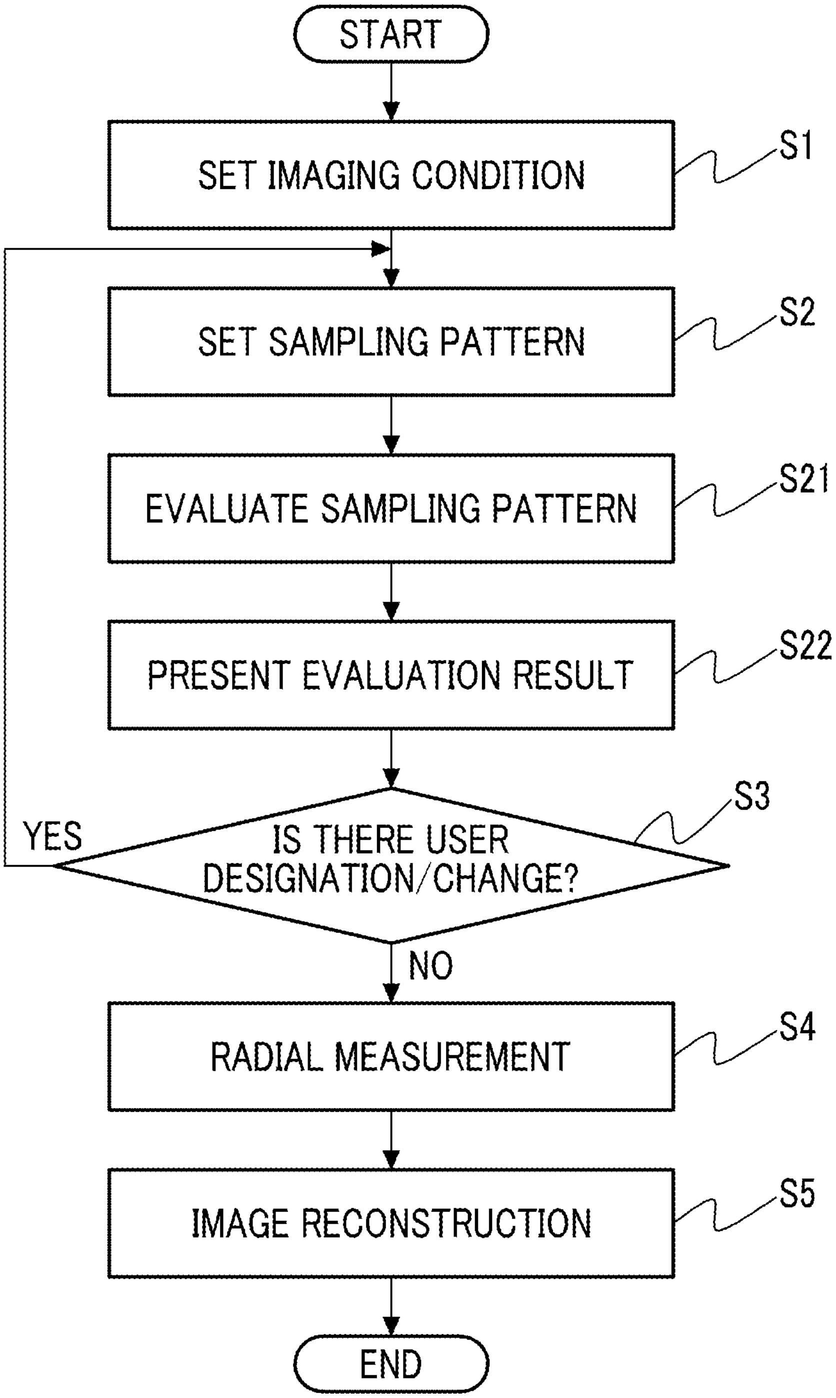
FIG. 11 is a diagram showing a flow of control of Embodiment 2.

Next, a flow of processing of the blade type radial measurement of the present embodiment will be described with reference to FIG. 11. In FIG. 11, processing similar to that in FIG. 7 is designated by the same reference numerals, and the duplicated description thereof will be omitted.

In the imaging control unit 310, in a case in which the blade type radial measurement is selected as the imaging method and the imaging condition is set (S1), the sampling pattern setting unit 340 sets the sampling pattern based on the imaging condition (S2). The evaluation unit 350 evaluates the sampling pattern set by the sampling pattern setting unit 340 (S21). In FIG. 11, the processing (FIG. 7: S3) for the user to designate or change the sampling pattern is omitted, but the user adjustment may be accepted before the evaluation of the evaluation unit 350. In that case, the sampling pattern after the adjustment by the user is evaluated.

As described above, for the evaluation, at least one of the generation of the pre-image or the calculation of the evaluation value based on the maximum value of the sidelobes or the sampling density is performed. The display control unit 320 displays the evaluation result of the evaluation unit 350 (S22). The user determines whether or not to make a new designation based on the displayed result. In a case in which there is no user designation (S3), the process transitions to step S4, the blade type radial measurement is executed with the set sampling pattern (S4), and the reconstructed image is displayed (S5).

Based on the result of the evaluation, the line intervals of the sampling pattern may be automatically adjusted on an apparatus side.

In this case, as shown in FIG. 8, the imaging control unit 310 is provided with the line interval adjustment unit 341 that implements a function of adjusting the line intervals, in association with the sampling pattern setting unit 340. In a case in which the evaluation result (evaluation value) of the evaluation unit 350 is input and the evaluation value is lower than a reference value set in advance, the line interval adjustment unit 341 changes the line intervals. The reference value is, for example, an evaluation value of even interval sampling in the general blade type radial measurement, an evaluation value improved by a certain percentage or greater than the evaluation value, or the like. Alternatively, it is determined that the sampling density is lower than the reference value in a case in which the sampling density does not satisfy a reference in one of the peripheral region or the center region, or the like. In a case in which the sampling density is used as the evaluation value, the line intervals are adjusted such that the sampling density is proper. In a case of the maximum value of the sidelobes, the line intervals at which the maximum value is minimized may be searched for by repeating the fine adjustment and the evaluation by the evaluation unit 350. The processing by the line interval adjustment unit 341 is included in or replaced with the user designation/change in step S3 in the flow of FIG. 11.

The display control unit 320 may also display the evaluation result during adjustment or after adjustment, the sampling pattern, the condition thereof or the pre-image at that time, and the like on the UI unit 40 even in a case in which the line interval adjustment is automatically performed in the apparatus.

By automatically adjusting the line intervals in this way, the user can avoid complicated work such as resetting the imaging condition. In addition, by displaying the result, it is possible to confirm that the sampling pattern is a desired sampling pattern.

According to the present embodiment, in addition to the same effects as in Embodiment 1, by performing the evaluation of the sampling pattern and the sampling pattern setting reflecting the result thereof, it is possible to further optimize the sampling with higher accuracy, and it is possible to suppress artifacts while achieving the acceleration.

In addition, by presenting the set sampling pattern to the user and displaying the GUI for accepting the condition related to the setting of the sampling pattern, the degree of freedom of the user in the setting of the sampling pattern by the user can be enhanced, enabling an appropriate setting. In particular, by providing a parameter for the user to adjust the set uneven intervals as the imaging condition, the user can clearly understand the adjustment target.

Embodiment of Display

Figure 12:
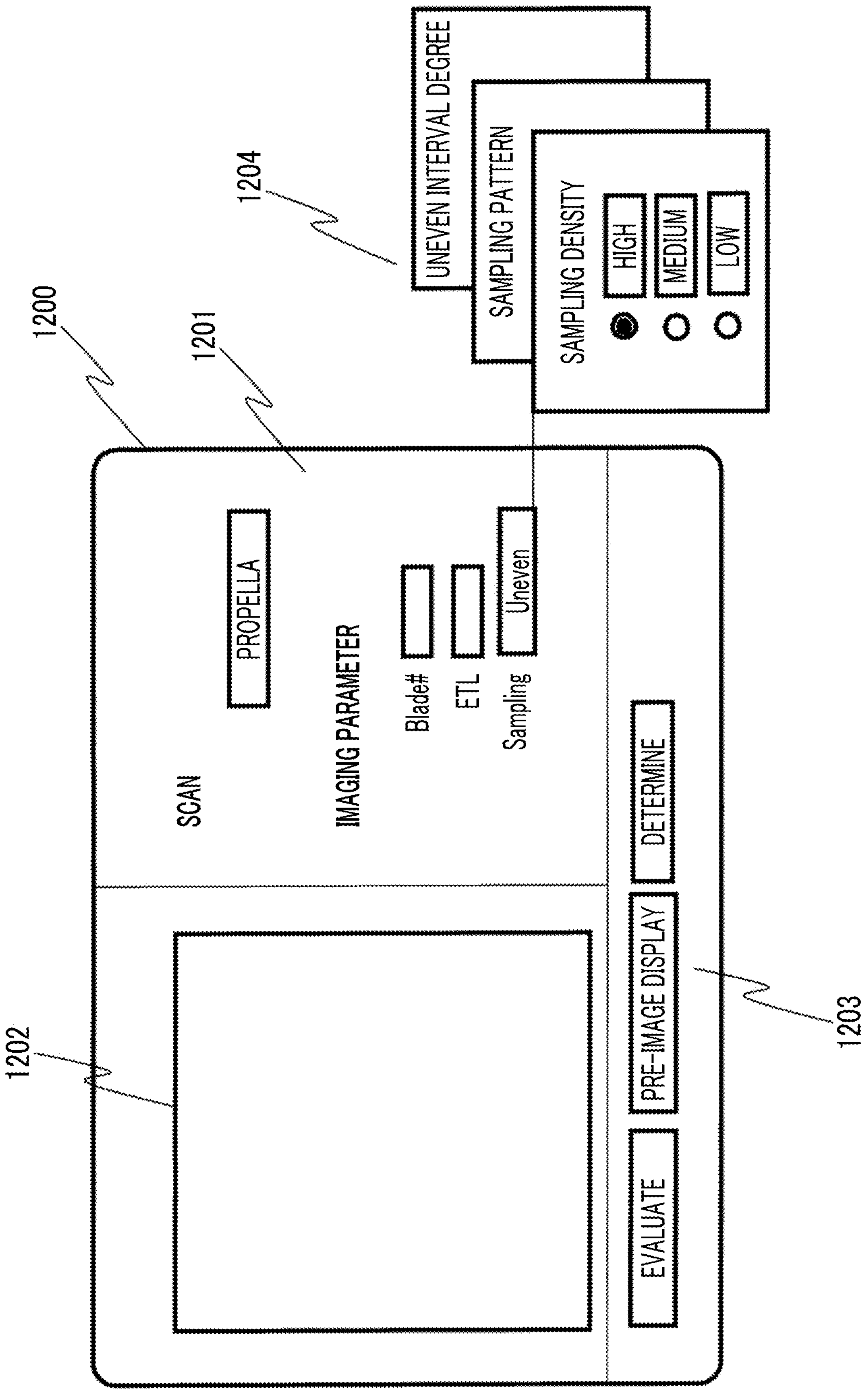
FIG. 12 is a diagram showing a display screen example of a UI unit.

FIG. 12 shows an example of the GUI for the user to perform the above-described adjustment and the like.

FIG. 12 is a diagram showing an example of a display screen 1200 of the display device of the UI unit 40, and in a broad sense, a block 1201 for inputting the imaging condition to the screen, an image display block 1202, and an operation button block 1203 are displayed. This screen is switched and displayed, for example, in a case in which the blade type radial measurement is selected on a previous imaging condition setting screen.

In the block 1201 for the imaging condition, as conditions specialized in the blade type radial measurement, the number of blades (the number of shots), ETL (the number of lines in the blade), selection of even intervals (even) or uneven intervals (uneven) for sampling, and the like are displayed. A value set in advance as a default is displayed, and the user can change the value. In a case in which the uneven intervals for sampling are selected, for example, a new window 1204 may be opened, and the sampling pattern (Type B, Type C, and the like) with the uneven intervals may be selected, the sampling density may be set, or an uneven interval degree and the like may be set.

In a case in which the function of the evaluation unit 350 is provided, the user operates each button of the operation button block 1203 to perform the evaluation, such as the calculation of the evaluation value and the generation of the pre-image, and the display of the evaluation result. The pre-image is displayed on the image display block 1202. The evaluation value may be displayed together with the image.

In addition, the set sampling pattern and condition are decided on through an operation of a determination button by the user.

The GUI of FIG. 12 and the above description are examples, and various changes can be made, such as omitting or modifying a part of the GUI, providing an additional instruction button, or providing a display block of an automatic adjustment result, according to the functions of the imaging control unit.

By providing such a user interface, the convenience of user-involved sampling pattern design is improved.

EXPLANATION OF REFERENCES

10: imaging unit
30: computer (controller)

310: imaging control unit
320: display control unit
330: image reconstruction unit
340: sampling pattern setting unit
350: evaluation unit

What is claimed is:

1. A magnetic resonance imaging apparatus configured to perform blade type radial measurements, the magnetic resonance imaging apparatus comprising:

an imaging unit that collects k-space data by measuring a nuclear magnetic resonance signal generated by a subject in accordance with a predetermined pulse sequence; and one or more processors that control sampling of the nuclear magnetic resonance signal, wherein the one or more processors perform control of radially sampling a k-space by varying an angle of a blade configured with a plurality of parallel sampling lines, and in the control, set interline intervals between the plurality of parallel sampling lines to uneven intervals for at least one of a plurality of the blades of the magnetic resonance imaging apparatus having different angles, and wherein the interline intervals for the blades of the magnetic resonance imaging apparatus are at least one of geometric series intervals, Fibonacci intervals, or intervals that change with quadratic functions.

2. The magnetic resonance imaging apparatus according to claim 1, wherein the one or more processors control the interline intervals such that the intervals are wider from a center toward an outside.

3. The magnetic resonance imaging apparatus according to claim 1, wherein the one or more processors perform control of varying a sampling pattern depending on the blade.

4. The magnetic resonance imaging apparatus according to claim 1, wherein the one or more processors include an evaluation unit that evaluates the sampling of the k-space.

5. The magnetic resonance imaging apparatus according to claim 4, wherein the evaluation unit evaluates the sampling by using a sampling density of the k-space as an evaluation value.

6. The magnetic resonance imaging apparatus according to claim 4, wherein the evaluation unit evaluates the sampling by using a maximum value of sidelobes of a point spread function (PSF) occurring in a sampling pattern as an evaluation value.

7. The magnetic resonance imaging apparatus according to claim 4, wherein the one or more processors adjust the interline intervals based on an evaluation value of the evaluation unit.

8. The magnetic resonance imaging apparatus according to claim 1, further comprising:

a UI unit that presents at least one of a sampling pattern of the k-space or a prediction image reconstructed from k-space data of the sampling pattern to a user.

9. The magnetic resonance imaging apparatus according to claim 1, further comprising:

a UI unit that accepts user selection or user adjustment of a sampling pattern of the k-space.

10. The magnetic resonance imaging apparatus according to claim 1, further comprising:

an image reconstruction unit that uses the k-space data to reconstruct an image of the subject through a Fourier transformation or iterative reconstruction operation.

11. The magnetic resonance imaging apparatus according to claim 10, wherein the one or more processors set the interline intervals to random intervals, and the image reconstruction unit generates the image through the iterative reconstruction operation.

12. The magnetic resonance imaging apparatus according to claim 1, wherein the pulse sequence is an FSE sequence or a GrE-based multi-echo sequence, in which one blade is sampled by one excitation pulse.

13. A control method for a magnetic resonance imaging apparatus including an imaging unit that collects k-space data by measuring a nuclear magnetic resonance signal generated by a subject in accordance with a predetermined pulse sequence, the control method comprising:

performing control of radially sampling a k-space by varying an angle of a blade configured with a plurality of parallel sampling lines, and in the control, setting interline intervals between the plurality of parallel sampling lines to uneven intervals for at least one of a plurality of the blades of the magnetic resonance imaging apparatus having different angles the interline intervals for the blades of the magnetic resonance imaging apparatus being at least one of geometric series intervals, Fibonacci intervals, or intervals that change with quadratic function.

14. The control method for a magnetic resonance imaging apparatus according to claim 13, further comprising:

evaluating a sampling pattern, wherein the uneven intervals are adjusted based on an evaluation result of the sampling pattern.

* * * * *